United States Patent [19]
Bhagwat et al.

[11] Patent Number: 5,636,114
[45] Date of Patent: Jun. 3, 1997

[54] LOSSLESS SNUBBER CIRCUIT FOR USE IN POWER CONVERTERS

[75] Inventors: Pradeep M. Bhagwat, Baltimore, Md.; Atluri R. Prasad, Fords; Chadd D. Justo, Jersey City, both of N.J.

[73] Assignee: Electronic Measurements, Inc., Neptune, N.J.

[21] Appl. No.: 565,553

[22] Filed: Nov. 30, 1995

[51] Int. Cl.$^6$ ............................................. H02M 7/06
[52] U.S. Cl. ............................................... 363/56
[58] Field of Search ........................ 363/79–82, 89, 363/222–225, 226, 55–56

[56] References Cited

U.S. PATENT DOCUMENTS

| | | | |
|---|---|---|---|
| 5,045,991 | 9/1991 | Dhyanchand et al. | 363/89 |
| 5,097,196 | 3/1992 | Schoneman | 323/222 |
| 5,134,355 | 7/1992 | Hastings | 323/211 |
| 5,134,356 | 7/1992 | El-Sharkawi et al. | 323/211 |
| 5,146,398 | 9/1992 | Vila-Masot et al. | 363/89 |
| 5,146,399 | 9/1992 | Gucyski | 363/89 |
| 5,177,677 | 1/1993 | Nakata et al. | 363/89 |
| 5,179,293 | 1/1993 | Hilton | 307/255 |
| 5,198,972 | 3/1993 | Lafuze | 363/138 |
| 5,224,025 | 6/1993 | Divan et al. | 363/16 |
| 5,233,509 | 8/1993 | Ghotbi | 363/89 |
| 5,235,504 | 8/1993 | Sood | 363/53 |
| 5,289,046 | 2/1994 | Gregorich et al. | 307/66 |
| 5,293,111 | 3/1994 | Weinberg | 323/222 |
| 5,301,095 | 4/1994 | Teramoto et al. | 363/21 |

OTHER PUBLICATIONS

J. Bazinet et al., "Analysis and Design of a Zero Voltage Transition Power Factor Correction Circuit", 1994 IEEE, pp. 591–597.

*Primary Examiner*—Aditya Krishnan
*Attorney, Agent, or Firm*—Michaelson & Wallace; John C. Pokotylo; Peter L. Michaelson

[57] ABSTRACT

A switching power converter employing a novel lossless zero-voltage-switching passive snubber network having a power range of up to 5 KW is presented. The passive snubber network improves efficiency, power density, and transient performance, reduces switching losses and EMI, and permits fixed frequency operation of the switching power converter. The passive snubber network also reduces and/or eliminates large peak currents and reverse recovery current spikes normally seen in conventional switching power converters. The proposed passive snubber network may be used in various switching power converter topologies such as boost, buck, balanced, and flyback power converters.

22 Claims, 11 Drawing Sheets

LOSSLESS SNUBBER CIRCUIT FOR USE IN POWER CONVERTERS

BACKGROUND OF THE INVENTION a) Field of the Invention

The present invention concerns DC to DC and single phase fed AC to DC switching power converters, and in particular, concerns switching power converters, having an output power of up to 5 KW (Kilo Watts), employing a novel lossless zero-voltage-switching (ZVS) passive snubber network. The proposed passive snubber network improves efficiency, power density, and transient performance, reduces switching losses and electro-magnetic interference (EMI), and permits fixed frequency operation of switching power converters. The proposed passive snubber network also reduces and/or eliminates large peak currents and reverse recovery current spikes which normally occur in known switching power converters. The proposed passive snubber network may be used in various switching power converter topologies such as boost, buck, forward, and flyback power converters.

b) Prior Art

In the past, power conversion, such as DC to DC power conversion for example, was typically performed by hard switched, pulse width modulating (PWM) circuits such as the "boost" power converter shown in FIG. 1, for example. This known power converter includes a controllable switch $S_1$ (such as a transistor (e.g., a MOSFET), for example) which can be provided with a fixed frequency switching signal from a controller. By varying the duty cycle of the switching signal, the output current of the power converter is controlled. This is known as pulse width modulation (or PWM) control.

Specifically, the conventional boost power converter of FIG. 1 includes a series connection of an inductor $L_1$, a diode $D_1$, and a capacitor $C_1$ coupled with the input voltage $V_{IN}$. The anode of the diode $D_1$ is coupled with the inductor $L_1$ while the cathode of the diode $D_1$ is coupled with the capacitor $C_1$. A load $R_L$ to be supplied with an output voltage is coupled across the capacitor $C_1$. A controllable switch $S_1$, such as a MOSFET for example, includes a first terminal coupled with a node between the inductor $L_1$ and the anode of the diode $D_1$ and a second terminal coupled with a lower potential terminal of the input voltage source $V_{IN}$.

In the conventional boost converter of FIG. 1, when the controllable switch $S_1$ is open (i.e., blocking), current flows through the inductor $L_1$ and the diode $D_1$. Since the uncharged capacitor $C_1$ initially appears as a short circuit (because it will draw current), the current flowing through the inductor $L_1$ and the diode $D_1$ will charge the capacitor $C_1$. When the controllable switch $S_1$ is subsequently closed (conducting), current from the input voltage $V_{IN}$ will flow through the inductor $L_1$ and the controllable switch $S_1$ to ground (or to the negative terminal of the input voltage supply). Assuming that there are no losses in the inductor $L_1$, equating the volt-seconds across the inductor $L_1$ to zero, and ignoring the turn-on voltage of the diode $D_1$, the output voltage $V_{OUT}$ can be determined from the following relationship:

$$V_{OUT} = V_{IN} * \frac{1}{1-D} \quad (1)$$

where D is the duty cycle of the switching signal. Thus, assuming that a fixed frequency switching signal is provided to the controllable switch $S_1$, the higher the duty cycle of the switching signal, the higher the output voltage supplied across the output load $R_L$.

The simple design of the known boost converter of FIG. 1 is based on an assumption that existing power switches closely approximate ideal switches, i.e., that the transitions from opened (i.e., blocking) to closed (i.e., conducting) and closed to opened occur instantaneously. Unfortunately, this assumption is not particularly accurate. Indeed, this assumption, and the power converter topologies it has spawned, are responsible for serious limitations in the performance of the conventional switching converters because the non-ideal (i.e., non-instantaneous) switching characteristic causes switching power ($P=I_{switch} * V_{switch}$) losses.

Specifically, one of the most important characteristics of a DC to DC power converter is that it has a high power density. To possess a high power density, the controllable switch of the power converter must operate at relatively high frequencies. Thus, conventional pulse width modulation power converters, such as the conventional boost power converter discussed above, are disadvantageous because increasing the switching frequencies to achieve higher power densities will cause an increase in switching losses.

In conventional hard switching PWM converters operating at frequencies below 100 KHz and at power levels up to 5 KW, diode stored charge, diode reverse recovery, and device switching losses are reportedly the biggest problems.

Diode reverse recovery in the conventional hard switching boost power factor converter presents a significant limitation because it generates substantial EMI and limits the power conversion frequency and efficiency, particularly in the 3 to 5 KW power range. Specifically, in the conventional hard switching boost converter of FIG. 1, when the switch $S_1$ is closed, the current through the switch $S_1$ increases to the level of the current through the inductor $L_1$. At this point, the current through the diode $D_1$ decreases until the diode $D_1$ no longer conducts. At this time, any charge stored on the diode $D_1$ is removed via switch $S_1$. As the charge is being removed from the diode $D_1$, the current through the switch $S_1$ continues to rise, often to a value of more than twice the inductor current level. The combination of high peak current, high dI/dt (current rate of change), and high dV/dt (voltage rate of change) when the voltage of the switch $S_1$ approaches the level of the lower potential terminal of $V_{in}$ (or ground), creates significant unwanted RFI/EMI noise and considerably stresses the switch $S_1$.

The problems of conventional hard switching PWM power converters (such as boost, buck, forward, and flyback power converters) are explained in greater detail in the article D. M. Divan, "Soft Switching Converters: A Review," *Soft Switching Converters: Topologies, Design, and Control: Summary of Publications 1986–1990: Wisconsin Electric Machines and Power Electronics Consortium*, pp. 1–51 (1990) (hereinafter referred to as "the Divan article" and incorporated herein by reference).

In response to the problems associated with hard switching PWM power converters described above, designers have proposed the use of reactive snubber networks to divert energy that would be dissipated during switching transitions by "trapping" that energy, thereby permitting "soft-switching" of the controllable switch (i.e., switching when little or no voltage appears across the switch and/or when little or no current is flowing through the switch thereby reducing switching stresses). There are two types of such soft-switching converters: (1) zero current switching (ZCS) converters in which opening (switch-off) and closing (switch-on) of the controllable switch occur with no current in the controllable switch; and (ii) zero voltage switching (ZVS) converters in which opening (switch-off) and closing (switch-on) of the controllable switch occur with no voltage across the switch.

Zero current switching (ZCS) is accomplished generally by employing a purely inductive snubber. Zero voltage switching (ZVS) on the other hand is accomplished by employing a purely capacitive snubber having an anti-parallel diode. With ZVS snubber circuits, closing (switch-on) occurs only when the anti-parallel diode is conducting; opening (switch-off) losses decrease with increasing capacitance. Unfortunately, to cause conduction in the anti-parallel diode before turning on the switch, additional circuitry is required to discharge the capacitor or an external resistor is required to dissipate the energy stored in the capacitor during a turn-on part of the switching cycle. Thus, although the controllable switch can operate at elevated frequencies because switching stresses are reduced, the power losses are merely shifted from the controllable switch to the dissipating resistor. Furthermore, if a snubber circuit is not properly designed, it will present a low impedance to the switch when it is turned on and off (closed and opened) which results in a large current spikes.

To solve the power dissipation problem, designers have developed "lossless" soft switching power converters in which the snubber networks are reset by means of inherent circuit operation. These lossless soft switching power converters "recirculate" the energy stored by the reactive snubbers to accomplish lossless operation. Other "lossless" soft switching power converters have snubber networks which are reset by using additional auxiliary switches in conjunction with reactive elements. Unfortunately, this way of eliminating spikes requires extra power handling components. These additional power handing components add size, weight, and cost to the power conversion system. Moreover, they often severely reduce overall system efficiency since the RMS input current is high.

An example of a known zero voltage switching (ZVS) boost power converter (See e.g., J. Bazinet et al., "Analysis and Design of a Zero Voltage Transition Power Factor Correction Circuit," *IEEE Applied Power Electronics Conference (APEC)*, pp. 591–597 (1994)) is illustrated in FIG. 2. As shown in FIG. 2, this known ZVS boost power converter is a modification of the hard switching boost converter of FIG. 1. Specifically, a capacitor $C_2$ is arranged across the switch $S_1$. A first series circuit, including an inductor $L_2$, a diode $D_2$ and a second switch $S_2$, is also arranged in parallel with the switch $S_1$. Further, a second series circuit, including a diode $D_3$, a diode $D_4$, and a resistor $R_1$ is arranged in parallel with the capacitor $C_1$. The first and second series circuits are electrically coupled, from a node between the inductor $L_2$ and the diode $D_2$ of the first series circuit to a node between the diodes $D_3$ and $D_4$ of the second series circuit.

The operation of the known ZVS boost power converter is explained below. To achieve zero voltage switching of the switch $S_1$, the auxiliary switch $S_2$ is turned-on (i.e., closed) near the end of the time switch $S_1$ is off (i.e., not conducting). Then, the current in the inductor $L_2$ increases until it reaches the level of the current in the input inductor $L_1$. Simultaneously, the capacitor $C_2$ and the inductor $L_2$ create a resonance thereby reducing the voltage across the switch $S_1$ to zero before the switch $S_1$ is turned-on (closed). The diode $D_1$ is turned off (opened) without the problem of a high reverse recovery current passing through the switch $S_1$. The capacitor $C_2$ minimizes the voltage across the switch $S_1$ to a very low value during turn-off (opening).

Unfortunately, this known ZVS boost power converter requires an active circuit element; namely, the second switch $S_2$. Being an active element, the second switch $S_2$ requires additional supporting circuitry (e.g., a base drive circuit) and introduces additional losses. The turn-off (opening) losses of the switch $S_2$ are significant because the inductor $L_2$ and the switch $S_2$ are carrying the load current before the switch $S_2$ is turned off (opened). Similarly, during the turn-on (closing) of the switch $S_2$, the capacitor $C_2$ will discharge through $L_2$ and $S_2$ thereby causing additional power dissipation. Therefore: (i) the energy stored in the parasitic capacitance of the switch $S_2$ dissipates in the switch $S_2$ during the turn-on (closing); (ii) the switch $S_2$ experiences substantial turn-off (opening) losses because before the turn-off (opening) of the switch $S_2$, it carries the full current of the inductor $L_1$; (iii) the inductor $L_2$ must be designed to limit any reverse recovery current spike from the diode $D_1$ during the turn-on (closing) of the switch $S_2$; (iv) the tailing effect of IGBTs (Insulated Gate Bipolar Transistors) during turn-off causes difficulties when using IGBTs in power converters having a power range of 3 to 5 KW.

Thus, the above mentioned known snubber circuits either: (a) use an active auxiliary switch in conjunction with the reactive elements (see e.g., the known ZVS boost power converter of FIG. 2) to relieve the voltage and current switching stresses of the controllable switch; or (b) use the controllable switch to provide energy to the circuit, that is, the energy used by the snubber circuit is drawn from the input and returned to the input.

Other known lossless power converters include resonant switching converters. These power converters incorporate reactive elements (capacitors and inductors) in conjunction with the switching device. The output voltage of these circuits is controlled by varying the operating frequency of the controllable switches. These circuits advantageously have low semiconductor switching losses and operate with sinusoidal waveforms. Unfortunately, resonant power converters exhibit increased component count, increased switching currents (peak and RMS) and require wide operating frequency variations to maintain a constant output voltage. Thus, resonant switching converters are relatively expensive, require relatively complex switching control circuitry, and eliminate switching losses at the expense of conducting losses.

A further example of a zero voltage switching (ZVS) quasi-resonant boost power converter is illustrated on page 14 of the Divan article. In this zero voltage switching (ZVS) boost power converter, a capacitor, along with an anti-parallel diode, are coupled across the controllable switch $S_1$ and an inductor is placed in series with the controllable switch $S_1$. (See phantom lines in FIG. 1.) The operation of this power converter is explained below. During the turn-off of the switch $S_1$, the inductor $L_2$ and the capacitor $C_2$ cause a resonance, thereby making the voltage across the switch $S_1$ nearly zero. Moreover, the switch $S_1$ is closed when its anti-parallel diode $D_2$ is conducting. Thus, the current is zero during turn-on (closing) of the switch $S_1$. However, the current flowing through the switch $S_1$ is sinusoidal. Thus, the peak and RMS (root mean square) currents are increased. Consequently, as stated above, the quasi-resonant power converter eliminates switching losses at the expense of conduction losses. Furthermore, a wide range of operating switching frequencies is required to maintain a constant output voltage.

Therefore, although these known lossless boost power converters have better characteristics than the hard switching converters and non-lossless soft-switching boost power converters, certain disadvantages remain. Specifically, the known ZVS boost power converter requires an additional auxiliary switch which requires additional support circuitry (e.g., a base drive circuit) and which introduces additional parasitic losses. Furthermore, the turn-off (opening) of the additional switch is not lossless as explained earlier. On the other hand, although resonant switching power converters eliminate switching losses, they introduce conducting losses. Moreover, as stated above, the output voltage in the resonant switching converters is controlled by frequency modulation. Therefore, this circuit requires additional circuitry to carry out such frequency modulation. Accordingly, an improved switching power converter employing an improved snubber network is needed.

The improved snubber network used by such a switching power converter should be a passive network; that is, the snubber network should include only resistors (not required in the present invention), capacitors, inductors, and diodes. The improved snubber network should use relatively inexpensive components. Moreover, the improved snubber network should enable the switching power converter to operate at higher switching frequencies to increase power density and to permit smaller components to be used. The improved snubber network should also eliminate reverse recovery current spikes in the switching power converter. The improved lossless soft switching power converter using the improved snubber network should also limit peak device voltage and current stresses, limit peak capacitor voltages, limit RMS currents in all components, have low sensitivity to second order effects (particularly when high switching frequencies are used), not require complex control circuitry, be fault tolerant, and have low electro-magnetic interference (EMI) and low radio frequency interference (FI). Lastly, the improved snubber network should be adaptable for use in various switching power converter topologies such as boost, buck, forward, and flyback power converters.

SUMMARY OF THE INVENTION

The present invention provides an improved lossless soft switching power converter having no additional active components and having relatively low conduction losses compared to resonant topologies. The present invention does so by modifying conventional switching power converters by providing an improved snubber network.

The snubber network of the present invention is used with a device for converting power from an input voltage source to be supplied to an output load via a first inductor and a first diode, based on a duty cycle of a switching signal supplied to a controllable switch. The snubber network of the present invention includes three series connections. The first series connection includes an inductor, a diode, and a capacitor, the second series connection includes a capacitor and a diode, and the third series connection includes a diode and an inductor. The third series connection is arranged between the first and second series connection such that the inductor of the third series connection is coupled at a node between the diode and the capacitor of the first series connection and the diode of the third series connection is coupled at a node between the capacitor and the diode of the second series connection. More specifically, the inductor of the third series connection is coupled with the cathode of the diode of the first series connection and the cathode of the diode of the third series connection is coupled with the anode of the diode of the second series connection.

The snubber network of the present invention is incorporated into a power converter as follows. The first series connection is coupled across the controllable switch of the power conversion circuit, the second series connection is arranged such that the cathode of the diode of the second series connection is coupled with the output voltage appearing across the output load (or alternatively, with the input voltage), and the third series connection is arranged between the first and second series connection such that the inductor of the third series connection is coupled at a node between the diode and the capacitor of the first series connection and the diode of the third series connection is coupled at a node between the capacitor and the diode of the second series connection.

In a preferred embodiment of the snubber network, a further inductor is coupled with the cathode of the diode of the power conversion circuit.

The snubber network of the present invention is designed for use with a switching power converter such that when the controllable switch is closed, voltage stored in the capacitor of the second series connection increases to the output voltage and when the controllable switch is opened, the voltage stored in the capacitor of the second series connection decreases to zero. Further, when the controllable switch is closed, voltage stored in the capacitor of the first series connection decreases from the output voltage to zero and when the controllable switch is opened, the voltage stored in the capacitor of the first series connection increases to the output voltage. The voltage of the first series connection may slightly overshoot the output voltage.

The snubber network of the present invention is designed for use with a switching power converter such that, at the instant when the controllable switch is opened, current through the controllable switch is relatively low such that switching losses are minimized. Further, at the instant when the controllable switch is closed, voltage across the controllable switch is relatively low such that switching losses are minimized.

In an alternative embodiment, the snubber network may also include a clamping diode coupled across the capacitor of the first series connection.

The snubber network of the present invention may be used with various switching power converter topologies such as boost power converters, buck power converters, forward power converters, and flyback power converters.

DETAILED DESCRIPTION

Figure 3:
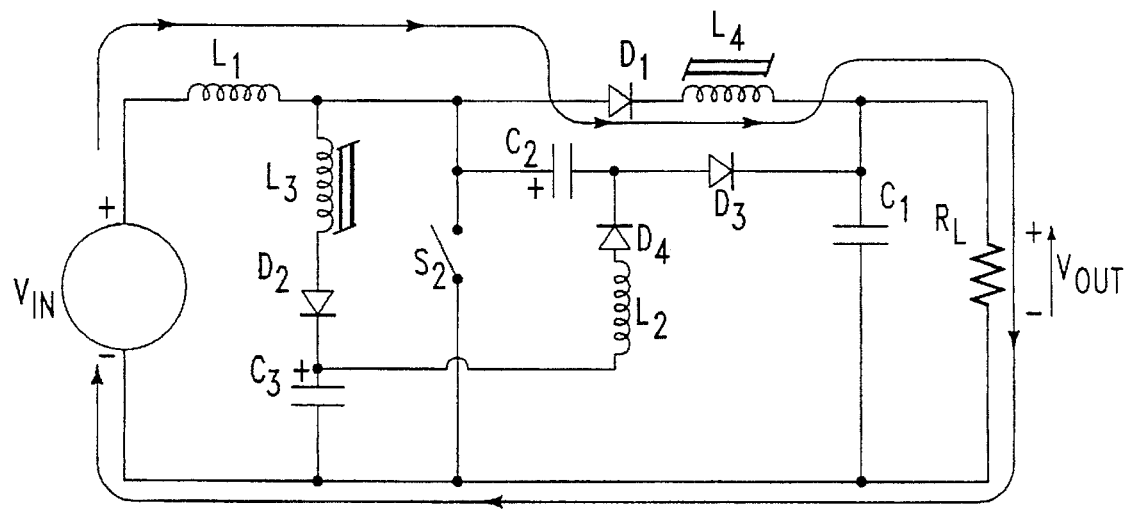
FIG. 3 is a schematic that illustrates the improved lossless soft switching PWM boost power converter employing the improved snubber network of the present invention and illustrates the state of the power converter at an instant just before the switch is turned-on (closed).

FIG. 3 is a schematic that illustrates a lossless soft switching PWM boost power converter which uses the improved passive snubber network of the present invention. As shown in FIG. 3, as with the known hard-switching power converter, the improved power converter of the present invention includes a voltage source $V_{in}$, an inductor $L_1$, a diode $D_1$, and an output load $R_L$, as well as a switch $S_1$ arranged in parallel with the current fed source network of $V_{in}$ and $L_1$.

The improved passive snubber network of the present invention used with this boost power converter, provides a first series circuit, having a saturable inductor $L_3$, a diode $D_2$ and a capacitor $C_3$, in parallel with the switch $S_1$. The first series circuit has a first terminal coupled with a node between the inductor $L_1$, the switch $S_1$, the anode of the diode $D_1$ and capacitor $C_2$ and a second terminal coupled with the lower potential terminal of the input voltage source $V_{in}$. Thus, the first series circuit of the improved snubber network is arranged across the switch $S_1$. Within the first series circuit, the inductor $L_3$ is coupled with the first terminal and the capacitor $C_3$ includes a first side coupled with the cathode of the diode $D_2$ and a second side coupled with the second terminal.

The improved snubber network of the present invention used with the boost power converter further provides a second series circuit, having capacitor $C_2$ and a diode $D_3$, in parallel with the diode $D_1$ and the inductor $L_4$. Within the second series circuit, the capacitor $C_2$ has a first side coupled with the anode of the diode $D_3$ and a second side coupled with the anode of the diode $D_1$. Thus, the second series circuit of the improved snubber network is clamped to the output voltage appearing across the output load $R_{load}$.

The improved snubber network of the present invention used with the boost power converter also provides a third series circuit having an inductor $L_2$ and a diode $D_4$. Within the third series circuit, a first terminal of the inductor $L_2$ is coupled at a node between the cathode of the diode $D_2$ and the capacitor $C_3$ of the first series circuit, a second terminal of the inductor $L_2$ is coupled with the anode of the diode $D_4$, and the cathode of the diode $D_4$ is coupled at a node between the capacitor $C_2$ and the anode of the diode $D_3$ of the second series circuit.

The improved snubber network of the present invention used with the boost power converter may also include an inductor $L_4$ coupled with the cathode of the diode $D_1$. This inductor $L_4$ is used to reduce current spikes otherwise caused by the reverse recovery of the diode $D_1$. Thus, the inductor $L_4$ helps reduce EMI and RF emission.

In the circuit of FIG. 3, the capacitance of the capacitor $C_2$ (which may have a value on the order of pico-farads) is much less than the capacitance of the capacitor $C_1$ (which may be on the order of micro-farads).

Figure 1:
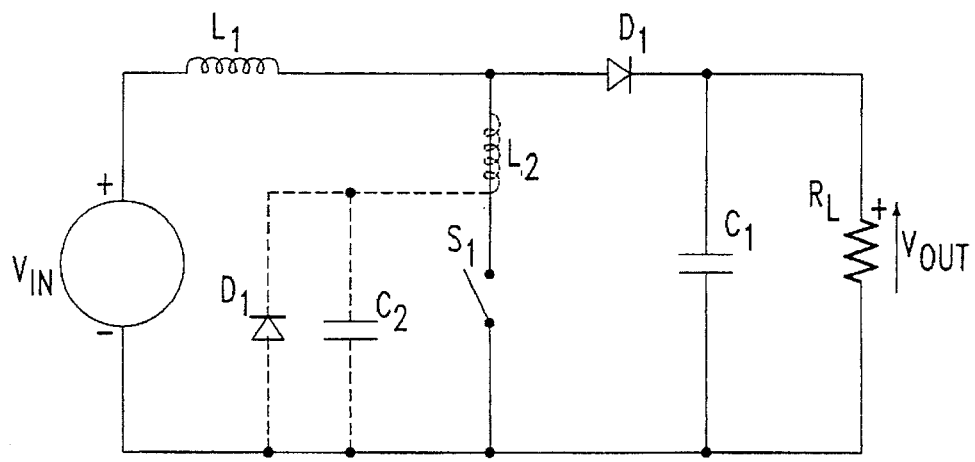
FIG. 1 is a schematic that illustrates a conventional hard switching PWM power converter having a boost topology.
Figure 2:
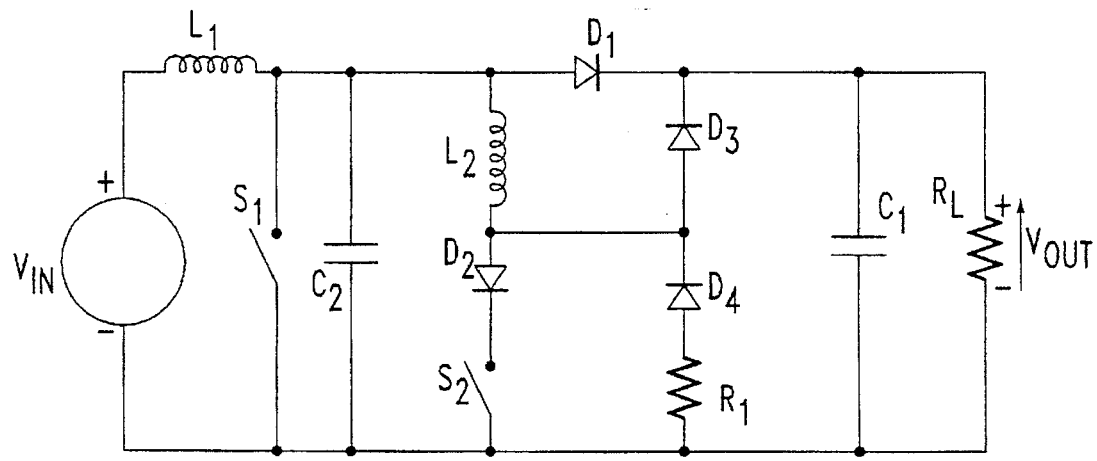
FIG. 2 is a schematic that illustrates a conventional ZVS soft switching boost power converter.

The overall operation of the boost power converter using the improved snubber network of the present invention is similar to the hard switching boost power converter of FIG. 1. The operation of the snubber network of the present invention when used in a boost power converter is explained below with reference to FIGS. 3, 4a through 4c, 5a through 5c, and 6a through 6l.

The state of the boost power converter of FIG. 3 at a time when the switch $S_1$ is turned off (not conducting), just before the switch $S_1$ is turned on, is as follows. Current flows to the output load via the inductor $L_1$, the diode $D_1$, and the inductor $L_4$. Current flowing through the loop defined by the inductor $L_1$, the capacitor $C_2$, the diode $D_3$, the load $R_L$, and the voltage supply charges the capacitor $C_2$ to less than one volt (i.e., a diode forward drop) (See FIG. 6f) and the capacitor $C_3$ to $V_{out}$ (See FIG. 6h).

Figure 4A:
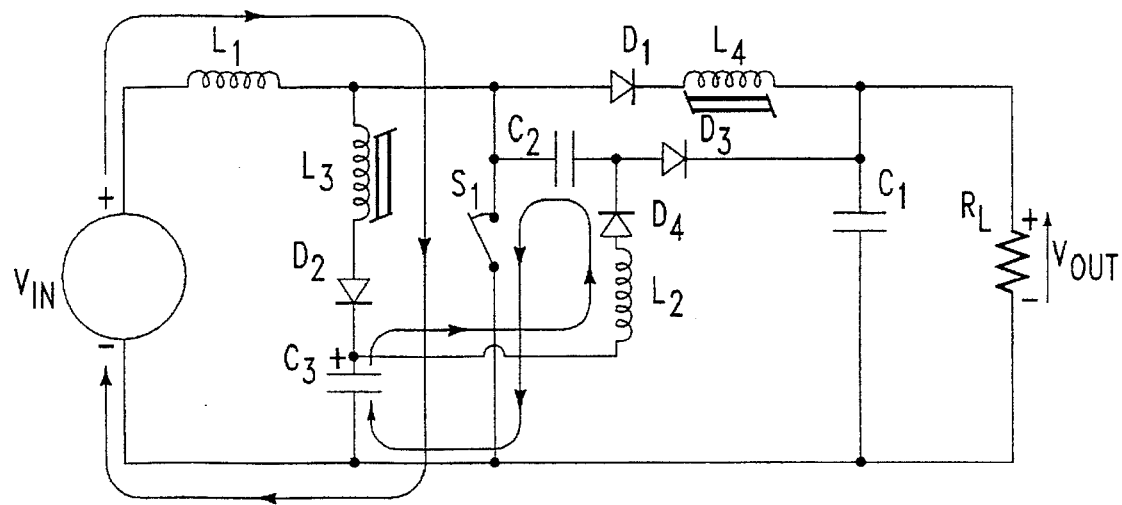
FIG. 4a is a schematic of the power converter of FIG. 3 that illustrates the operation of the power converter when the switch is closed.
Figure 6A:
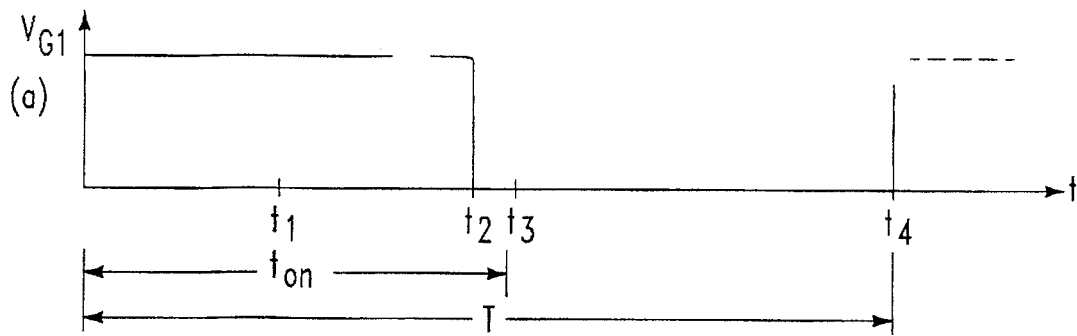
FIGS. 6a through 6i are timing diagrams illustrating the currents and voltages across various elements of the improved lossless soft switching PWM boost converter of the present invention.
Figure 6B:
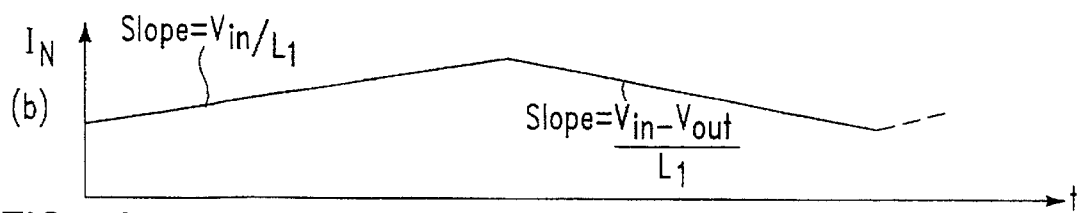
Figure 6C:
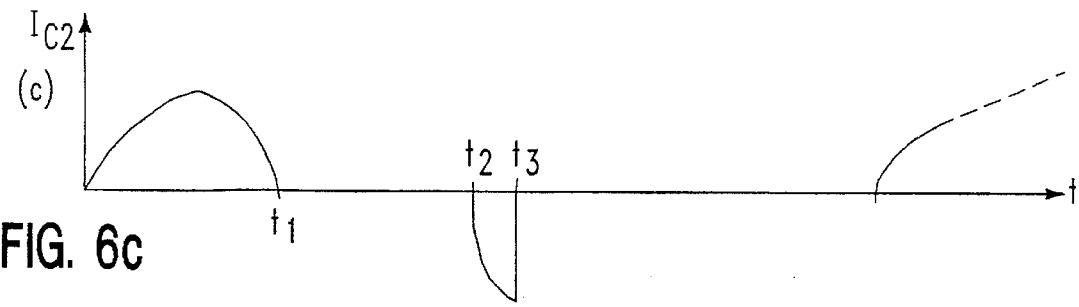
Figure 6D:
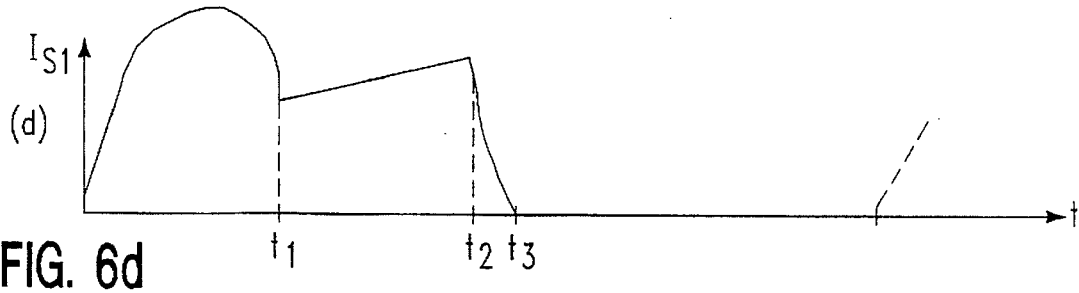
Figure 6E:
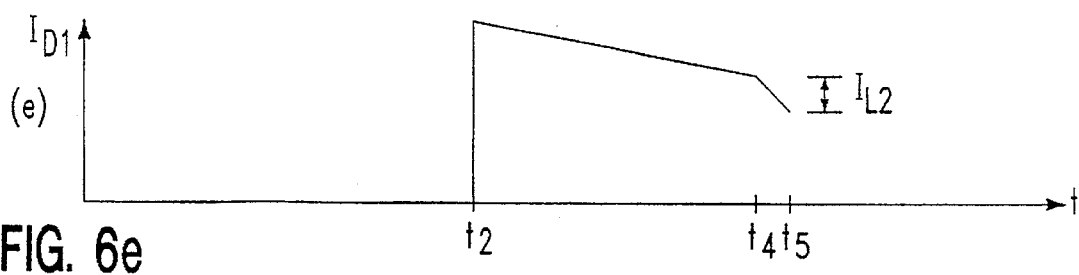
Figure 6F:
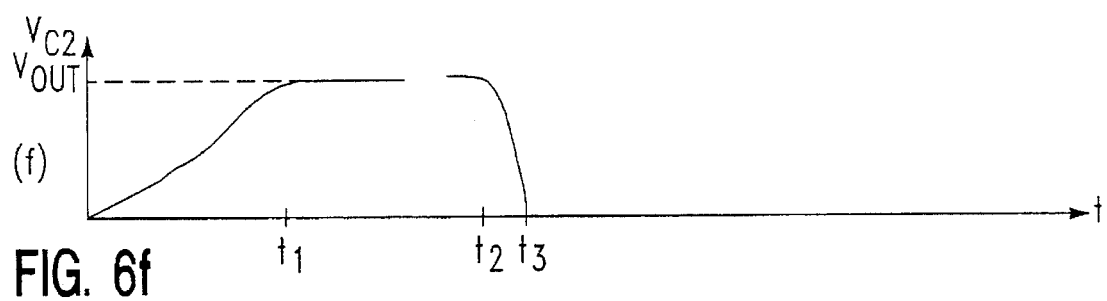
Figure 6G:
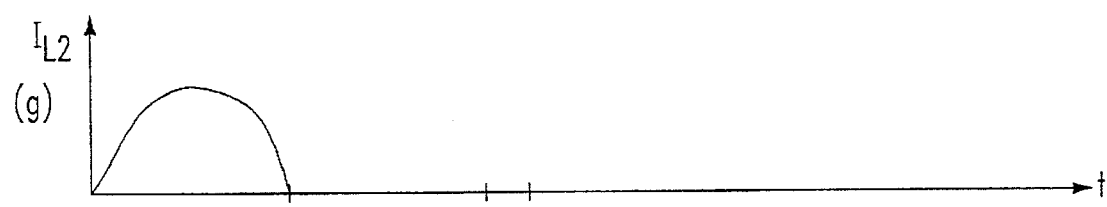
Figure 6H:
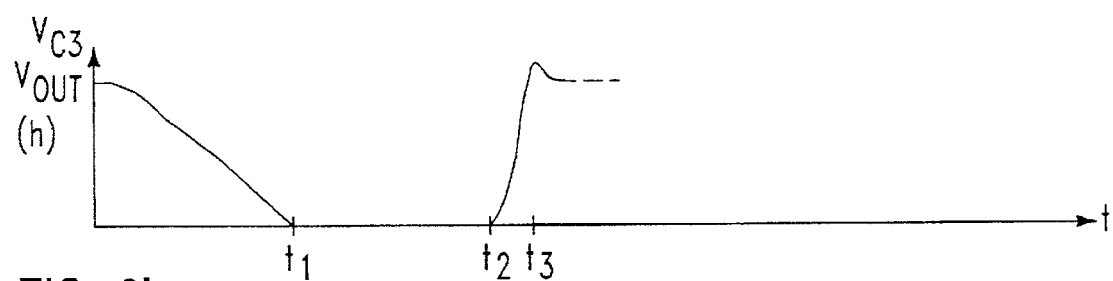

As shown in FIG. 4a, at a first instant in time, when the switch $S_1$ is first closed, a current will flow through a loop defined by the capacitor $C_3$, the inductor $L_2$, the diode $D_4$, the capacitor $C_2$, and the switch $S_1$, thereby discharging the capacitor $C_3$ as shown in FIG. 6h and charging the capacitor $C_2$ as shown in FIG. 6f. This continues until the reversed charge on the capacitor $C_2$ reaches $V_{out}$. The value of the capacitor $C_3$ is selected such that when the charge on the capacitor $C_2$ reaches $V_{out}$, the charge on the capacitor $C_3$ will be zero. (See times $t_1$ and $t_2$ of FIGS. 6f and 6h). The charge on the capacitor $C_2$ and the discharging of the capacitor $C_3$ may occur about less than 1 (one) μs after the switch $S_1$ is closed. If the voltage of the capacitor $C_2$ reaches $V_{out}$ (plus the turn-on voltage of the diode $D_3$), the diode $D_3$ becomes forward biased thereby clamping the voltage of the capacitor $C_2$ to output voltage.

The current ($I_{C2}$) flowing through the loop defined by the capacitor $C_3$, the inductor $L_2$, the diode $D_4$, the capacitor $C_2$ and the switch $S_1$ can be expressed by the following:

$$\frac{1}{C_3} \int I_{C2} dt + L_2 \frac{dI_{C2}}{dt} + \frac{1}{C_2} \int I_{C2} dt = 0. \quad (2)$$

where the power semiconductor forward voltage drops are neglected, and where $0 < t < t_1$.

This expression can be reduced to the following:

$$L_2 \frac{d^2 I_{C2}}{dt^2} + I_{C2} \left[ \frac{1}{C_2} + \frac{1}{C_3} \right] = 0; \text{ or} \quad (3)$$

$$\frac{d^2 I_{C2}}{dt^2} + \frac{I_{C2}}{L_2} \left[ \frac{1}{C_2} + \frac{1}{C_3} \right] = 0., \quad (4)$$

wherein $0 < t < t_1$.

A solution of this differential equation is given by:

$$I_{C2}(\omega t) = A \sin(\omega t) + B \cos(\omega t) \quad (5)$$

where $$\omega = \frac{1}{\sqrt{L_2 \left[\frac{1}{C_2} + \frac{1}{C_3}\right]}},$$

$$= \frac{1}{\sqrt{\frac{L_2(C_2 + C_3)}{C_2 C_3}}},$$

$$= \sqrt{\frac{C_2 C_3}{L_2(C_2 + C_3)}},$$

where $0 < t < t_1$.

At time $t=0$, the switch $S_1$ is turned-on (closed) and $I_{C2}(0)=0$. Therefore, $0 = A \sin 0 + B \cos 0$ and $B=0$. Accordingly, $$I_{C2}(\omega t) = A \sin(\omega t). \tag{6}$$

The voltage of the capacitor $C_3$ is expressed as:

$$V_{C3} = \frac{1}{C_3} \int I_{C2} dt \tag{7}$$

$$= \frac{1}{C_3} \int A \sin(\omega t) dt$$

$$= \frac{A}{\omega C_3} \cos(\omega t).$$

At time $t=0$, $V_{C3} = V_{OUT}$. Therefore:

$$V_{OUT} = \frac{A}{\omega C_3} \cos(0); \text{ and thus} \tag{8}$$

$$A = \omega C_3 V_{OUT} \tag{9}$$

Therefore, as shown in FIG. 6c, the current $I_{C2}$ can be expressed as:

$$I_{C2}(\omega t) = A \sin(\omega t) + B \cos(\omega t) \tag{10}$$

$$= \omega C_3 V_{OUT} \sin \omega t, \tag{11}$$

where $0 < t < t_1$.

The operation of the DC to DC power converter is now explained with reference to FIG. 6b. Under steady state operating conditions, when the switch $S_1$ is turned-on (closed), the current in the inductor $L_1$ rises at a rate of $\frac{V_{in}}{L_1}$ and when the switch $S_1$ is turned-off (opened), the current falls at a rate of $$\frac{V_{in} - V_{OUT}}{L_1}.$$

The input current ripple can be controlled by controlling the frequency of the switching signal and the output power can be controlled by controlling the duty cycle of the switching signal. Specifically, the duty cycle is related to the input and output voltages from equation (1):

$$D = 1 - \frac{V_{IN}}{V_{OUT}}. \tag{12}$$

$V_{IN}$ is a DC voltage source in the case of a DC to DC power converter and $V_{IN}=|V^* \sin(wt)|$ in the case of an AC to DC power converter. Assuming a known input current in the case of a DC to DC power converter, the current $I_{S1}$ through the switch $S_1$ is the sum of the input current $I_i$ times the duty cycle D, and the snubber current $I_{C2}$ derived above and illustrated in FIG. 6d. In other words: $I_{S1}(\omega t) = I_i * D + I_{C2}$ (where $0 \leq \omega t \leq t_{on}$). The current $I_{S1}$ through switch $S_1$ during turn-on is illustrated in FIG. 6d.

Figure 5:
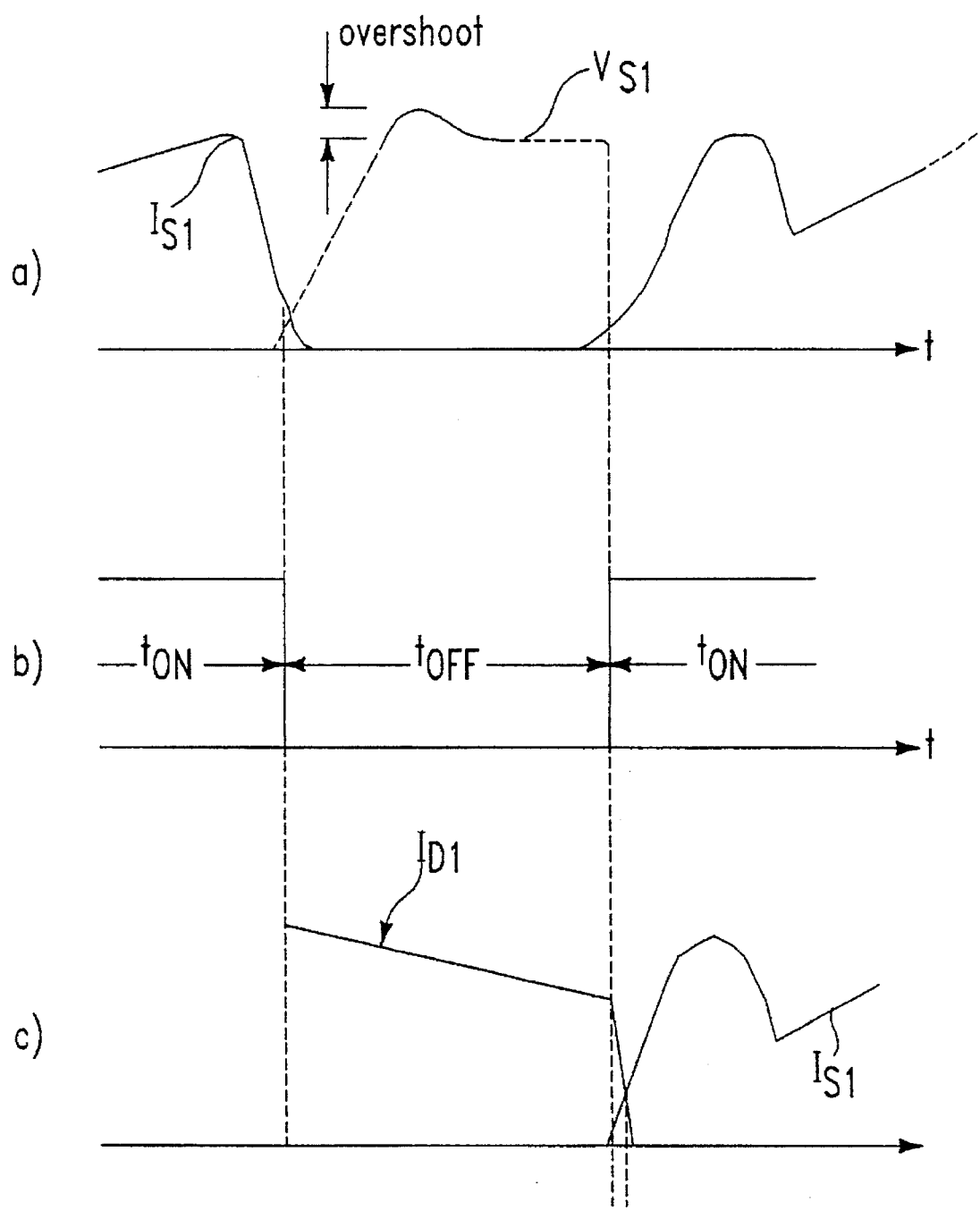
FIGS. 5a through 5c are timing diagrams illustrating the zero voltage turn-off and zero current turn-on of the switch of the improved lossless soft switching PWM boost converter of the present invention.

Further, when the switch $S_1$ is closed, the current $I_{S1}$ through the switch $S_1$ will not rise instantaneously because the inductor $L_4$ will continue to conduct a decaying current as shown in FIG. 5c. Therefore, after the switch $S_1$ is turned-on (closed), the current $I_{S1}$ through the switch $S_1$ will rise linearly as the current through the inductor $L_4$ decays linearly. (See FIGS. 5a and 5c.) This linear decay facilitates zero-current turning-on (closing) of the switch $S_1$. Furthermore, the decaying current in the inductor $L_4$ causes the current through the diode $D_1$ to go to zero. The diode $D_1$ then turns-off. Thus, the current spike caused by diode reverse recovery associated with the known boost power converter design is eliminated.

As discussed above, after the switch $S_1$ is turned-on, the voltage of the capacitor $C_2$ reaches $V_{out}$ and the voltage on the capacitor $C_3$ is zero, the current continuing to flow through the inductor $L_2$ decays to zero. That is, the energy stored in the inductor $L_2$ is given to the load $R_L$ via diodes $D_4$ and $D_3$. The decay of the current in the inductor $L_2$ occurs quickly because the voltage of the capacitor $C_3$ is much less than that of the capacitors $C_1$ and $C_2$.

Consequently, when the switch $S_1$ is turned-on (closed), the current flowing through it $I_{S1}$ (See FIG. 6d) is a combination of: (i) the current flowing through the inductor $L_1$ (See FIG. 6b); and (ii) the current flowing from the capacitor $C_3$ to the capacitor $C_2$ via the inductor $L_2$ and the diode $D_4$ (See FIG. 6c).

When the switch $S_1$ is turned-on (closed), current also flows through the input voltage supply $V_{in}$, the inductor $L_1$ and the switch $S_1$.

Figure 4B:
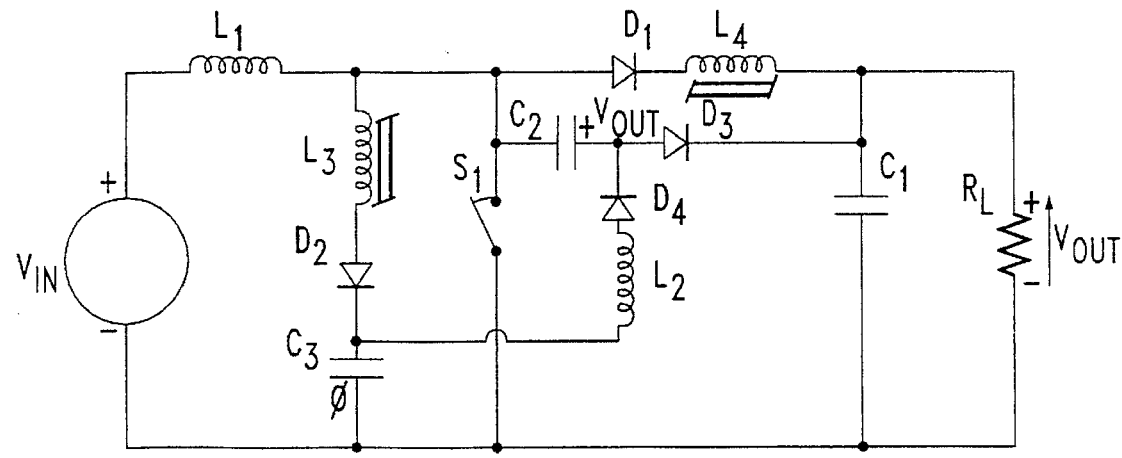
FIG. 4b is a schematic of the power converter of FIG. 3 which illustrates the initial condition of capacitor $C_2$ at an instant just before the switch is turned-off (opened).
Figure 4C:
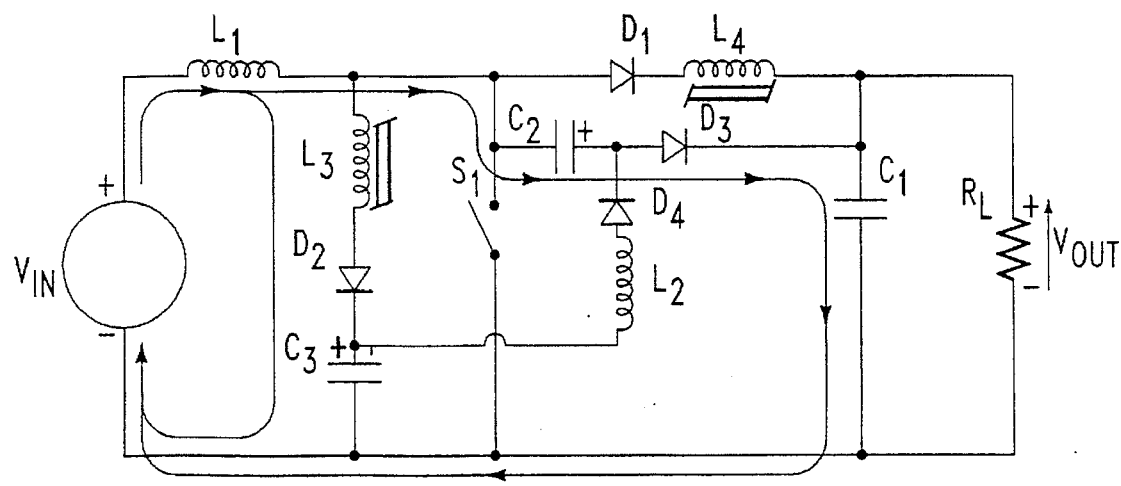
FIG. 4c is a schematic of the power converter of FIG. 3 that illustrates the operation of the power converter when the switch is open.

Thus, the state of the power converter of FIG. 4b at a time when the switch $S_1$ is on (conducting), just before the switch $S_1$ is turned off, is as follows. The voltage across the capacitor $C_3$ is zero (See FIG. 6h) and the voltage across the capacitor $C_2$ is $V_{out}$ (See FIG. 6f). Since the charge on the capacitor $C_2$ is $V_{out}$, there is no voltage drop across the switch $S_1$.

At this time, the switch $S_1$ is turned-off (opened) as shown in FIG. 4c and FIGS. 5a through 5c and 6a through 6i. As FIG. 4c further illustrates, the current of the inductor $L_1$ flows through: (i) a loop defined by the capacitor $C_2$, the diode $D_3$, the capacitor $C_1$, and the voltage source $V_{in}$ (see FIG. 6c); and (ii) a loop defined by the diode $D_2$, the capacitor $C_3$, and the voltage supply $V_{in}$. Therefore, the voltage rise of the capacitor $C_3$ depends on the value of the current flowing through $L_1$ before the switch $S_1$ is turned-off and the capacitance of the capacitor $C_3$. The voltage of the capacitor $C_2$ is discharged at a rate determined by the value of the current flowing through the inductor $L_1$ just before the switch $S_1$ is turned-off and the capacitance of the capacitor $C_2$.

Assuming that the capacitors $C_2$ and $C_3$ have the same capacitance, the design of the circuit can be simplified. For example, if the capacitors $C_2$ and $C_3$ have the same capacitance, the current flowing through the capacitor $C_2$ and the capacitor $C_3$ is half the value of the current $I_{L1}$ flowing through the inductor $L_1$ before the switch $S_1$ is turned-off. Therefore, the voltage rise across the switch $S_1$ during turn-off can be expressed as:

$$dV_{S1}/dt = I_{L1}/2C_3 \tag{13}.$$

Figure 6I:
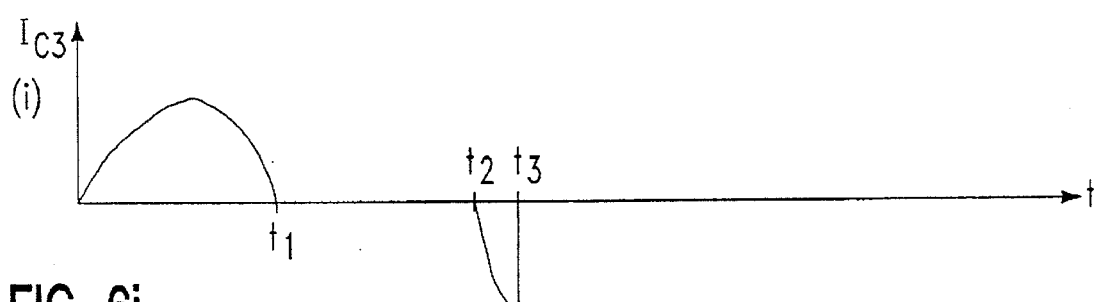

Using equation (13), the value of the capacitor $C_3$ for any given switch $S_1$ (at turn-off time) can be determined. During turn-off of the switch $S_1$, the current through the switch $S_1$ starts decreasing and the magnitude of the current through the capacitors $C_2$ and $C_3$ starts increasing as shown in FIGS. 6c, 6d, and 6i. Thus, the current $I_{L1}$ through the inductor $L_1$ can be expressed as:

$$I_{L1}(t)=I_{S1}(t)+I_{C2}(t)+I_{C3}(t) \text{ where } T2<t<T3. \quad (14)$$

As shown in FIG. 5a, the voltage across the switch $S_1$ will rise from zero to the voltage of the capacitor $C_1$ plus a small voltage (due to inductor $L_4$) until the diode $D_1$ becomes forward biased. The value of this switch voltage overshoot during turn-off is dictated by the inductance of the inductor $L_4$. However, if the snubber network is designed properly, the overshoot will be limited to 60 to 70 volts higher than the output voltage $V_{out}$. This overshoot is not a problem in a boost power converter in the range of 3 to 5 KW. For example, a 4 KW power factor converter has been implemented using a 500 V MOSFET switch. In this converter, the peak voltage (including overshoot) of the switch was found to be 450 V. Thus, in such an implementation, the overshoot is not a problem. Once the diode $D_1$ starts conducting, the current flowing through the inductor $L_1$ begins to flow through the diode $D_1$. These conditions remain the same until the next turn-on (closing) of the switch $S_1$.

As described above with respect to a boost power converter topology, an improved snubber network in accordance with the present invention is provided. The improved snubber network comprises: (i) a first series connection of the inductor $L_3$, the diode $D_2$, and the capacitor $C_3$ coupled across the switch $S_1$; (ii) a second series connection of the capacitor $C_2$ and the diode $D_3$ arranged such that the capacitor $C_2$ is coupled with a terminal of the switch $S_1$ and the cathode of the diode $D_3$ is coupled with the output voltage appearing across the load $R_L$; (iii) a third series connection of the diode $D_4$ and the inductor $L_2$ having a first end terminal coupled at a node between the diode $D_2$ and the capacitor $C_3$ of the first series connection and having a second end terminal coupled at a node between the capacitor $C_2$ and the diode $D_3$ of the second series connection; and (iv) the inductor $L_4$ coupled with the cathode of the diode $D_1$. To reiterate, this improved snubber network uses only passive circuit elements.

The improved snubber network of the present invention can be used in other power converter topologies as well. In each case, the first series connection of the inductor $L_3$, the diode $D_2$, and the capacitor $C_3$ is coupled across the switch $S_1$; the second series connection of the capacitor $C_2$ and the diode $D_3$ is arranged such that the capacitor $C_2$ is coupled with a terminal of the switch $S_1$ and the cathode of the diode $D_3$ is coupled with the input voltage source $V_{in}$ or with the output load $R_{out}$; the third series connection is coupled between the first and second series circuit; and the inductor $L_4$ is coupled with the diode $D_1$.

Figure 7:
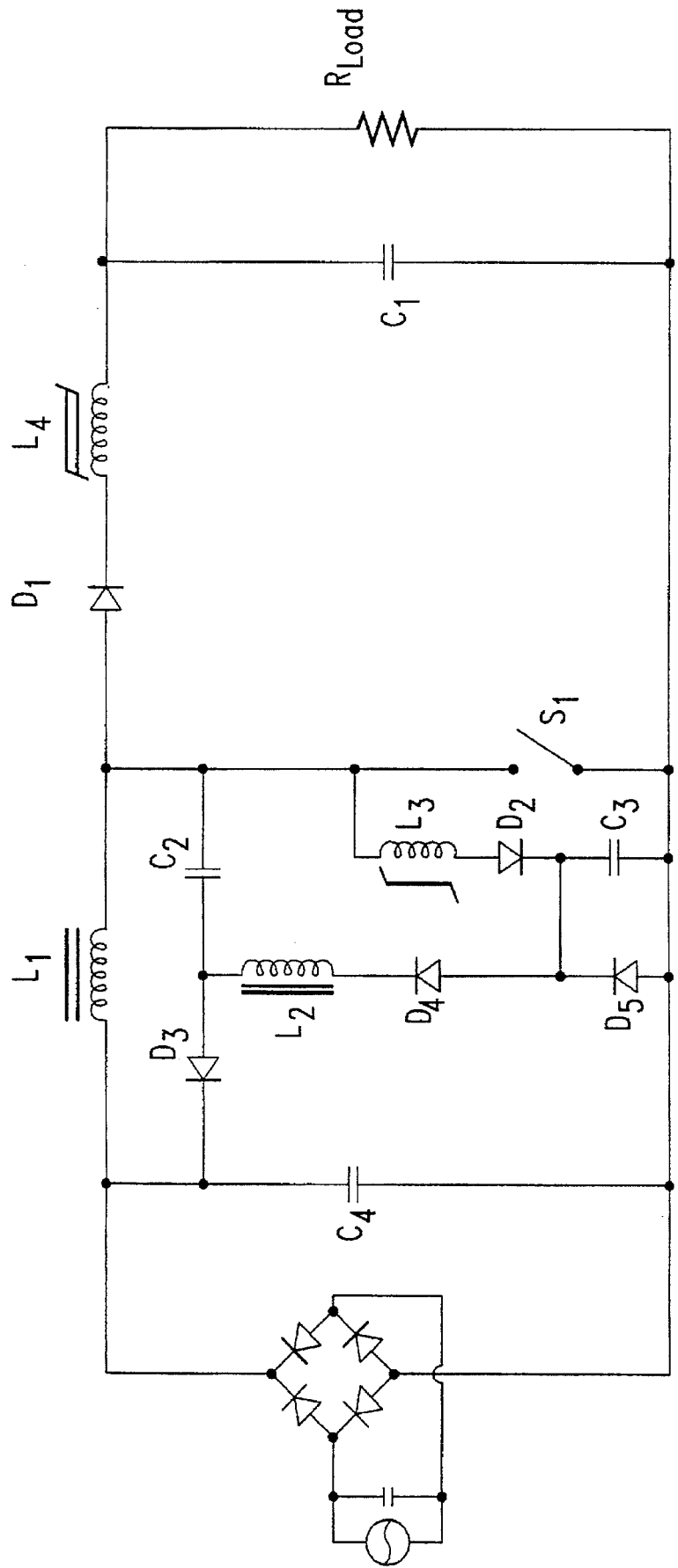
FIG. 7 is a schematic of an alternative embodiment of a lossless boost power converter using the improved snubber network of the present invention.

For example, the improved snubber network of the present invention can be used in the alternative boost power converter shown in FIG. 7. The alternative embodiment of the boost power converter shown in FIG. 7 differs from the embodiment shown in FIG. 3 in that: (i) the cathode of the diode $D_3$ is coupled with the input voltage source $V_{in}$ rather than the output load $R_{load}$; (ii) an additional capacitor $C_4$ is arranged across the input voltage source $V_{in}$; and (iii) an additional diode $D_5$ is provided across the capacitor $C_3$.

The operation of the alternative boost power converter of FIG. 7 is almost the same as the boost power converter of FIG. 3 except that: (i) the voltage stored by the capacitor $C_2$ is clamped to the input voltage and therefore changes between $+V_{in}$ and $-V_{in}$ during the turn-off of the switch $S_1$; and (ii) the diode $D_5$ prevents the capacitor $C_3$ from becoming negatively charged.

Figure 8:
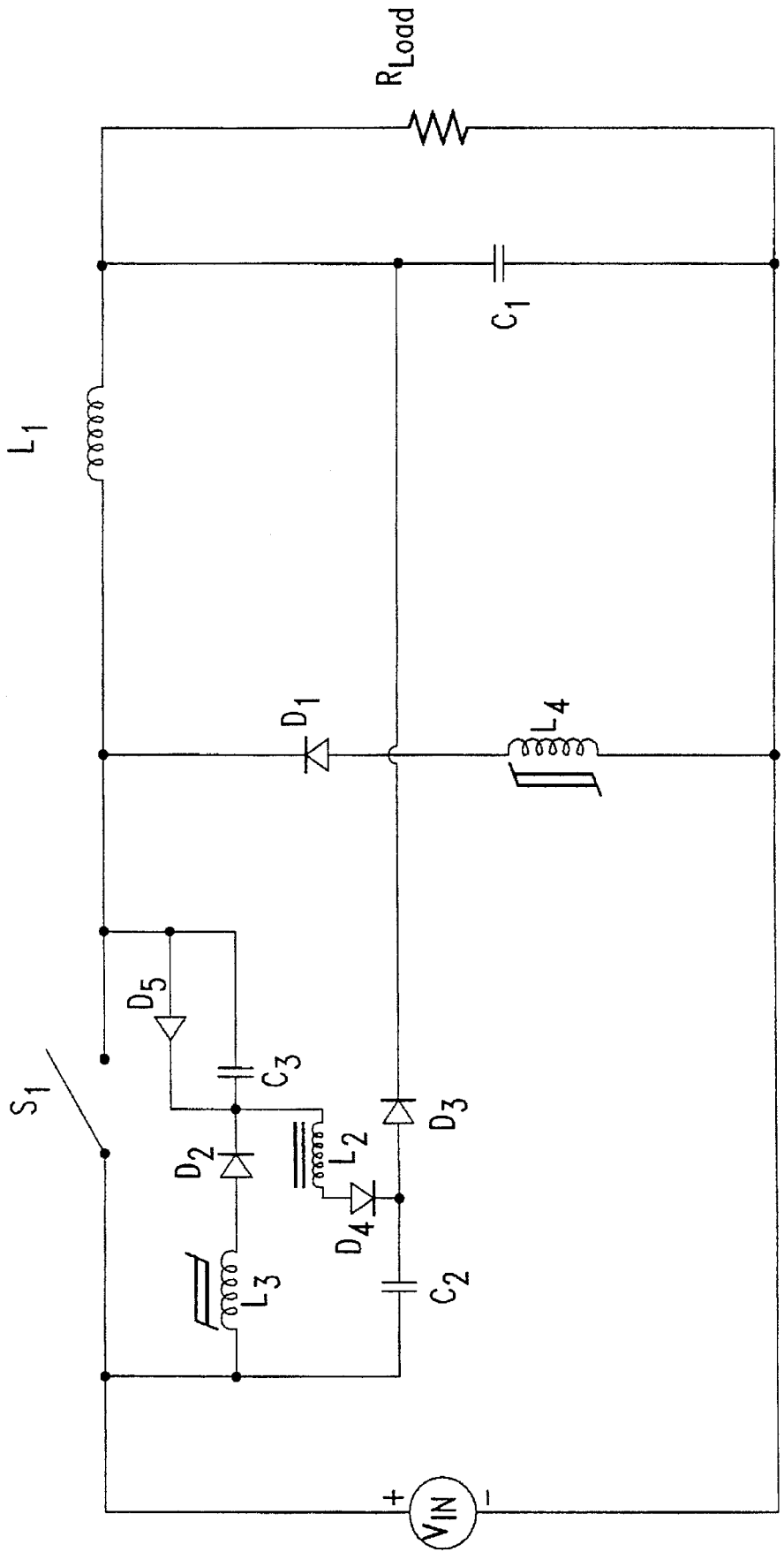
FIG. 8 is a schematic of a lossless buck power converter using the improved snubber network of the present invention.
Figure 9:
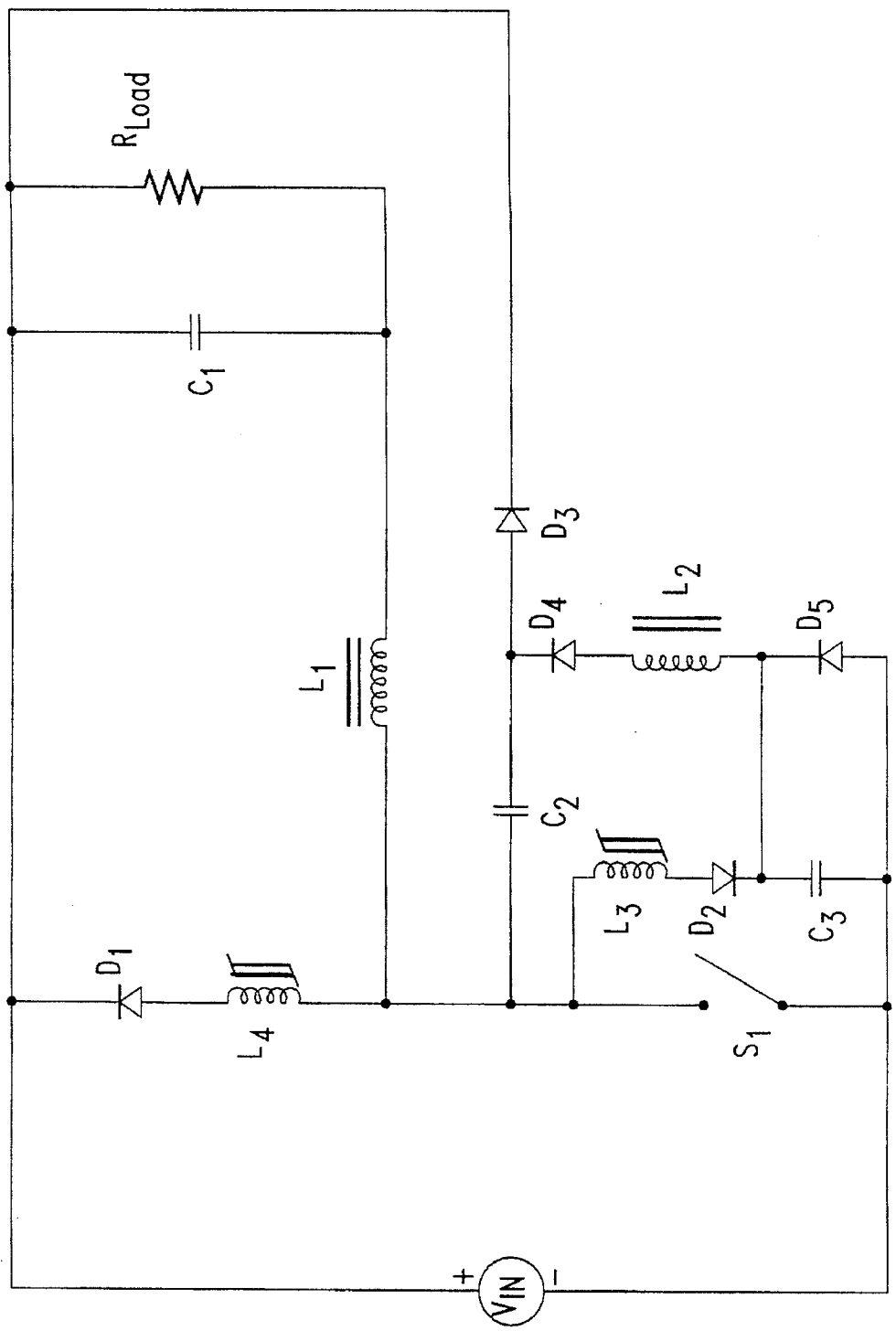
FIG. 9 is a schematic of an alternative embodiment of the lossless buck power converter using the improved snubber network of the present invention.
Figure 10:
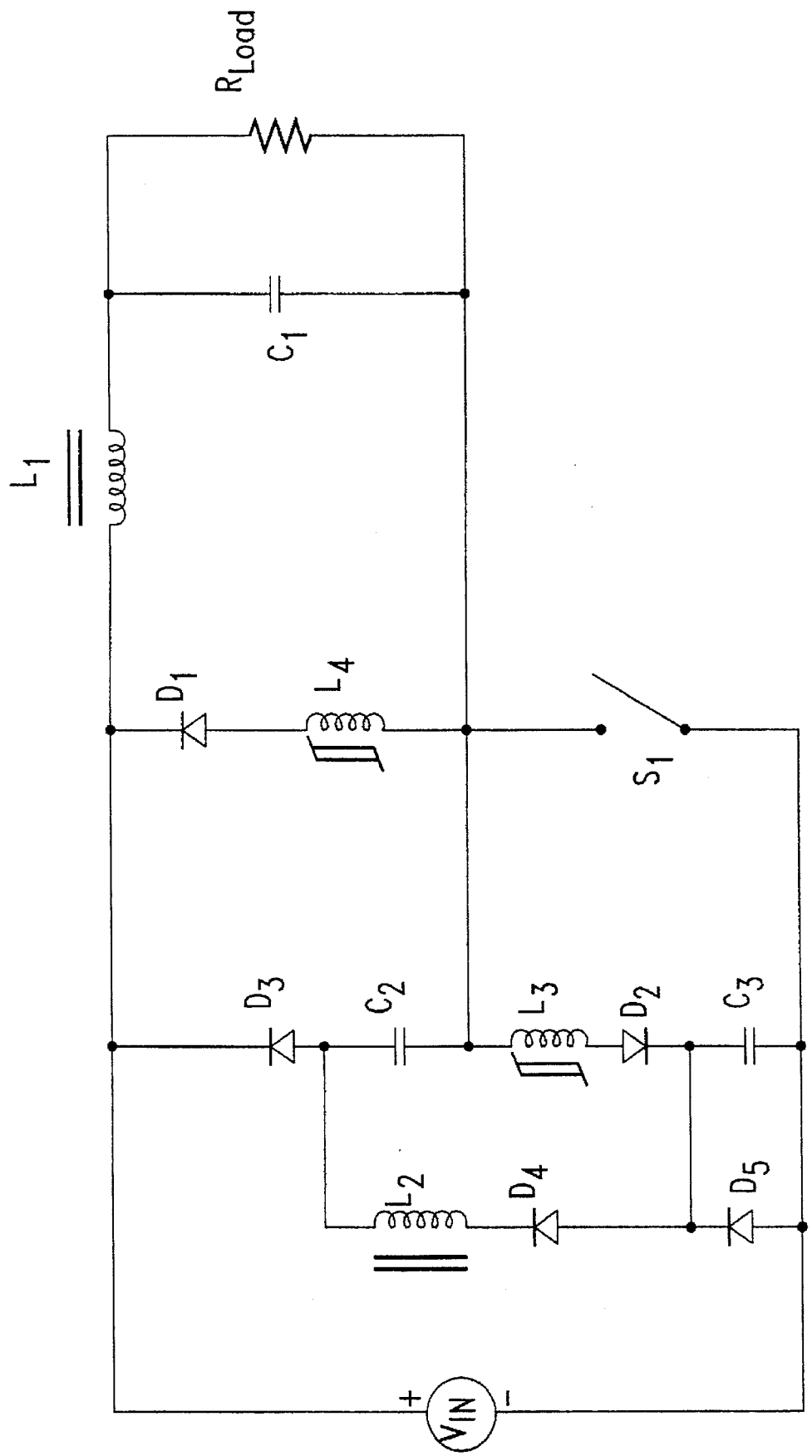
FIG. 10 is a schematic of a further alternative embodiment of the lossless buck power converter using the improved snubber network of the present invention.

The improved snubber network can also be used in other power converter topologies. For example, FIGS. 8 through 10 are schematics showing the snubber network used in three embodiments of a buck converter topology. As shown in FIG. 1.1(a) on page 4 of the Divan article, a buck converter generally includes a series connection of an input voltage supply $V_{in}$ (shown as $V_1$ in the Divan article), a controllable switch $S_1$, an inductor $L_1$, and an output load $R_{load}$. A diode $D_1$ (shown as S2 in the Divan article) is arranged across the input voltage supply $V_{in}$ such that its anode is coupled with a lower potential terminal of the input voltage supply $V_{in}$ and its cathode is coupled at a node between the controllable switch $S_1$ and the inductor $L_1$. An output capacitor $C_1$ is arranged across the output load $R_{load}$.

FIG. 8 is a schematic which shows a first embodiment of the buck power converter using the improved snubber network of the present invention in which (i) the first series circuit of the inductor $L_3$, the diode $D_2$ and the capacitor $C_3$ is arranged across the controllable switch $S_1$; (ii) the second series circuit of the capacitor $C_2$ and the diode $D_3$ is arranged such that the capacitor $C_2$ is coupled with a terminal of the switch $S_1$ and the cathode of the diode $D_3$ is coupled with the output load $R_{load}$ (alternatively, the cathode of the diode $D_3$ may be coupled with the input voltage supply $V_{in}$); (iii) the third series circuit of the diode $D_4$ and the inductor $L_2$ is arranged between the first and second series circuits; and (iv) the inductor $L_4$ is coupled with the anode of the diode $D_1$. The voltage of the capacitor $C_2$ is clamped to $V_{out}$ during turn-on of the switch $S_1$ and charges to $+V_{in}$ and $-V_{in}$ during turn-off of the switch $S_1$. Similar to the boost power converter of FIG. 7, a diode $D_5$ is provided across the capacitor $C_3$ to prevent the capacitor $C_3$ from becoming negatively charged.

FIG. 9 is a schematic which shows a second embodiment of a buck power converter using the improved snubber network of the present invention, in which: (i) the first series circuit of the inductor $L_3$, the diode $D_2$ and the capacitor $C_3$ is arranged across the controllable switch $S_1$; (ii) the second series circuit of the capacitor $C_2$ and the diode $D_3$ is arranged such that the capacitor $C_2$ is coupled with a terminal of the switch $S_1$ and the cathode of the diode $D_3$ is coupled with the output load $R_{load}$ (alternatively, the cathode of the diode $D_3$ may be coupled with the input voltage supply $V_{in}$); (iii) the third series circuit of the diode $D_4$ and the inductor $L_2$ is arranged between the first and second series circuits; and (iv) the inductor $L_4$ is coupled with the anode of the diode $D_1$. In this second embodiment of the buck power converter, the voltage of the capacitor $C_2$ is clamped to the voltage across the output load $R_{load}$. A diode $D_5$ may be coupled across the capacitor $C_3$ to prevent it from becoming negatively charged.

FIG. 10 shows a third embodiment of a buck power converter using the improved snubber network of the present invention, in which: (i) the first series circuit of the inductor $L_3$, the diode $D_2$ and the capacitor $C_3$ is arranged across the controllable switch $S_1$; (ii) the second series circuit of the capacitor $C_2$ and the diode $D_3$ is arranged such that the capacitor $C_2$ is coupled with a terminal of the switch $S_1$ and the cathode of the diode $D_3$ is coupled with the input voltage source $V_{in}$ (alternatively, the cathode of the diode $D_3$ may be coupled with the output load $R_{load}$); (iii) the third series circuit of the diode $D_4$ and the inductor $L_2$ is coupled between the first and second series circuits; and (iv) the inductor $L_4$ is coupled with the anode of the diode $D_1$. An additional diode $D_5$ may be coupled across the capacitor $C_3$ to prevent the capacitor $C_3$ from becoming negatively charged.

Figure 11:
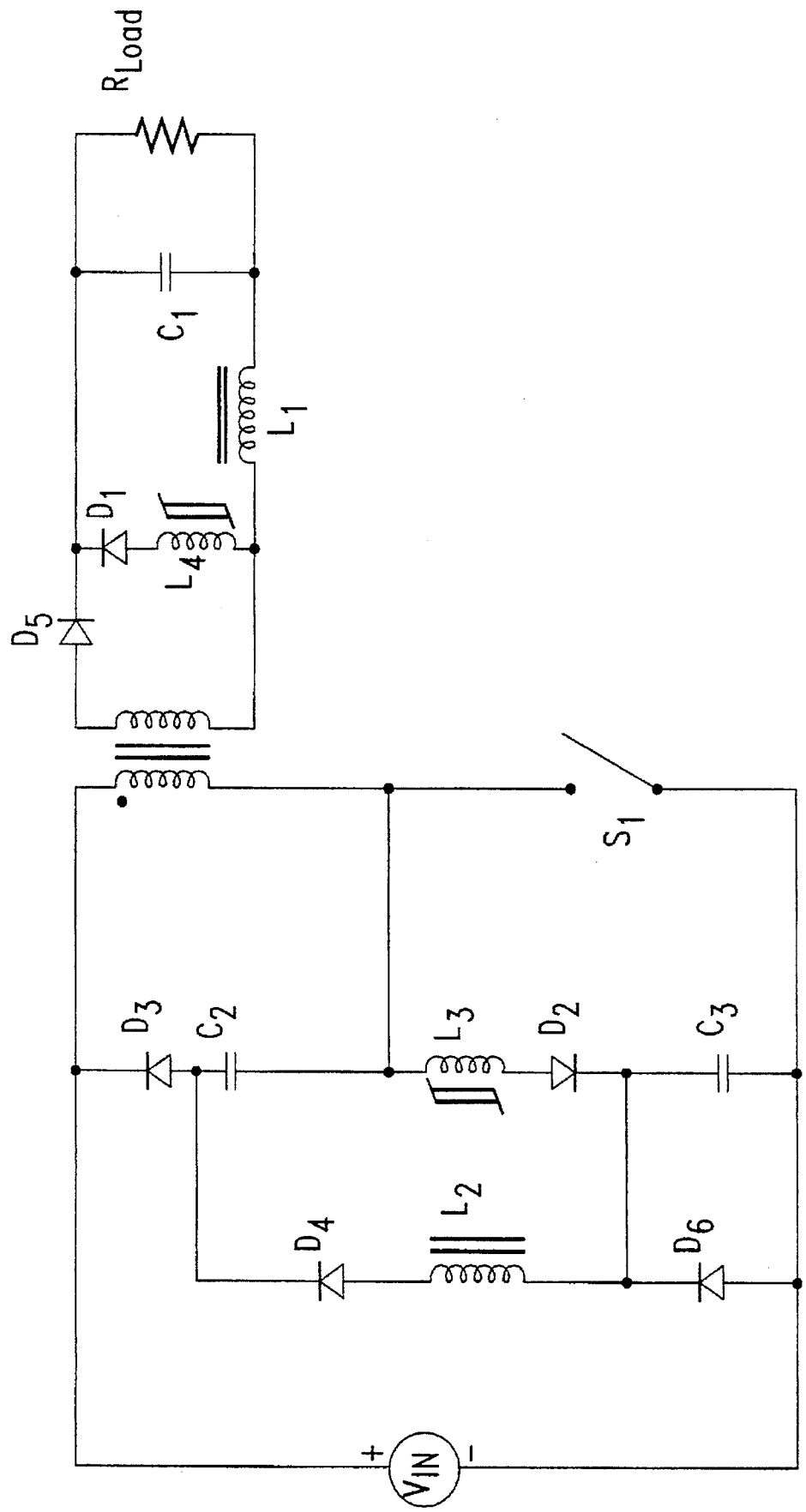
FIG. 11 is a schematic of a lossless forward power converter using the improved snubber network of the present invention.

FIG. 11 is a schematic which shows a forward power converter using the improved snubber network of the present invention. A conventional forward power converter is illustrated in FIG. 1.2(b) on page 4 of the Divan article. In the conventional forward power converter, a first loop is formed from a series connection of an input voltage source $V_{in}$ (labeled $V_1$ in the Divan article), a primary winding of a transformer, and a controllable switch $S_1$. A second loop includes a series connection of a diode $D_5$ (labeled S3 in the Divan article), the output load $R_{load}$ (labeled as $Z_L$ in the Divan article), the inductor $L_1$, and the secondary of the transformer. An output capacitor $C_1$, as well as a diode $D_1$ (labeled as S2 in the Divan article), are arranged across the output load $R_{load}$.

In the forward power converter including the improved snubber network of the present invention of FIG. 11: (i) the first series circuit of the inductor $L_3$, the diode $D_2$ and the capacitor $C_3$ is arranged across the controllable switch $S_1$; (ii) the second series circuit of the capacitor $C_2$ and the diode $D_3$ is arranged such that the capacitor $C_2$ is coupled with a terminal of the switch $S_1$ and the cathode of the diode $D_3$ is coupled with the input voltage source $V_{in}$; (iii) the third series circuit of the diode $D_4$ and the inductor $L_2$ is coupled between the first and second series circuits; and (iv) the inductor $L_4$ is coupled with the anode of the diode $D_1$. In this forward power converter, the improved snubber network of the present invention clamps the voltage of the capacitor $C_2$ to $V_{in}$ during the turn-on period of the switch $S_1$. This circuit advantageously permits the PWM control to be used for output voltage control. A further diode $D_6$ may be arranged across the capacitor $C_3$ to prevent the capacitor $C_3$ from becoming negatively charged.

Figure 12:
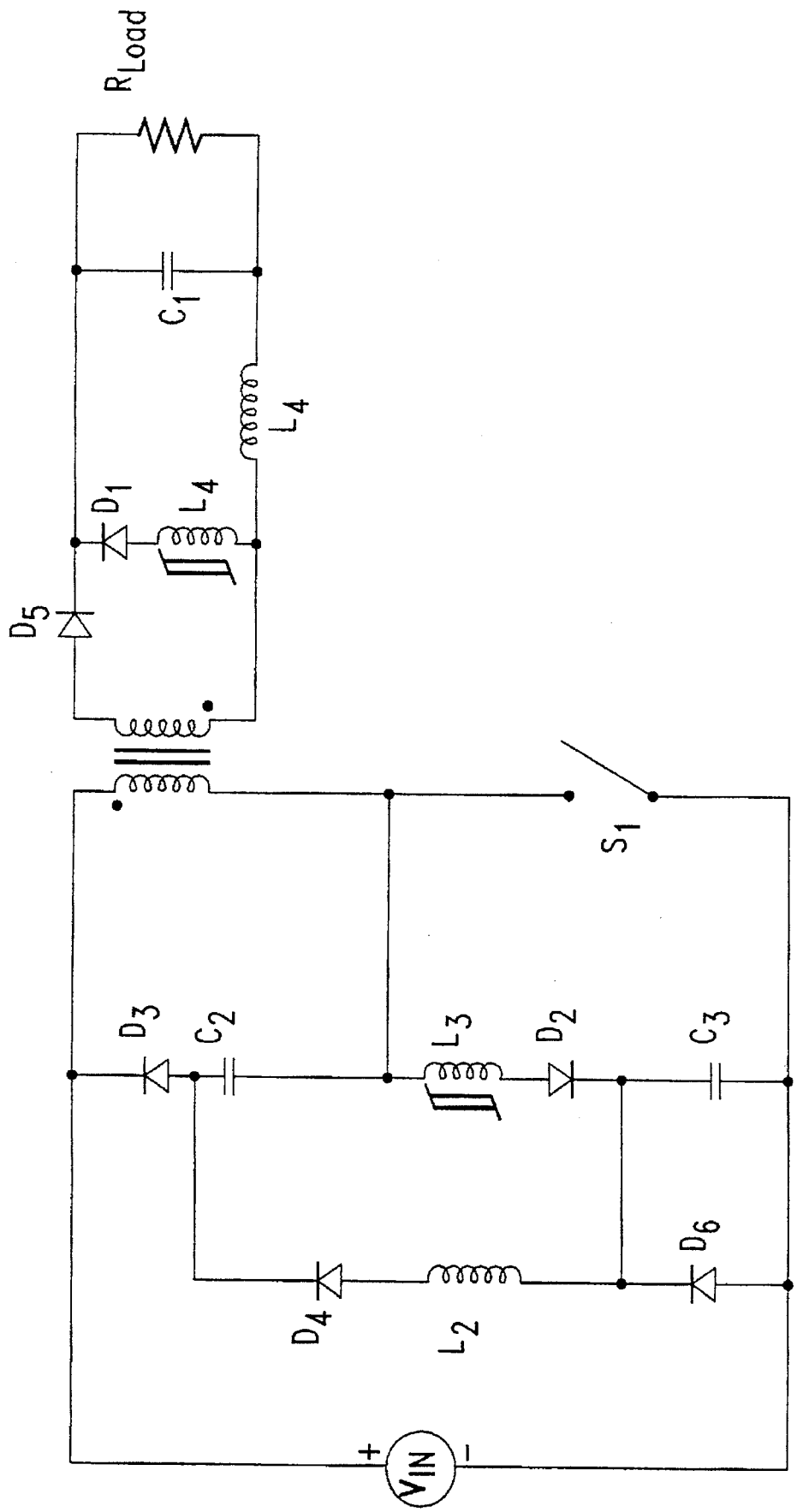
FIG. 12 is a schematic of a lossless flyback power converter using the improved snubber network of the present invention.

FIG. 12 is a schematic of a flyback power converter using the improved snubber network of the present invention. A conventional flyback power converter is shown in FIG. 1.2(a) of the Divan article. The conventional flyback power converter includes a first loop including a series connection of the input power supply $V_{in}$ (labeled as $V_1$ in the Divan article), a primary winding of a transformer, and a controllable switch $S_1$. The conventional flyback power converter further includes a second loop including a diode $D_5$ (labeled as S2 in the Divan article) an output load $R_{load}$ (labeled as $Z_1$ in the Divan article), an inductor $L_1$, and a secondary winding of the transformer. An output capacitor $C_1$ is arranged across the output load $R_{load}$, as is a diode $D_1$.

The flyback power converter of FIG. 12, which includes the improved snubber network, includes: (i) the first series circuit of the inductor $L_3$, the diode $D_2$ and the capacitor $C_3$ arranged across the controllable switch $S_1$; (ii) the second series circuit of the capacitor $C_2$ and the diode $D_3$ arranged such that the capacitor $C_2$ is coupled with a terminal of the switch $S_1$ and the cathode of the diode $D_3$ is coupled with the input voltage source $V_{in}$; (iii) the third series circuit of the diode $D_4$ and the inductor $L_2$ coupled between the first and second series circuits; and (iv) the inductor $L_4$ is coupled with the anode of the diode $D_1$. In the flyback power converter of FIG. 12, the improved snubber circuit clamps the voltage of the capacitor $C_2$ to $V_{in}$ during the switch-on period of the controllable switch $S_1$ and allows zero current turn-on of the switch $S_1$.

As described above with respect to the first embodiment of the boost power converter (See FIG. 3), when the switch $S_1$ is turned-off (opened), no voltage exists across it (See FIG. 5a), and when the switch $S_1$ is turned-on (closed), no current instantaneously flows through it (See FIG. 5c). Accordingly, the switch operation is lossless. Moreover, operation of the power converters using the snubber network of the present invention at high switching frequencies is practical. Since the operation of the improved power converters using the snubber network of the present invention is practical at high switching frequencies, the power density of the power converter can be increased and smaller components can be used. Further, the lossless switching of the improved power converters using the snubber network of the present invention limits peak device voltage and current stresses, limits peak capacitor voltages, limits RMS currents in all components, is relatively insensitive to second order effects (particularly when high switching frequencies are used), and has relatively low electro-magnetic interference (EMI) and low radio frequency interference (RFI). Moreover, the improved power converters using the snubber network of the present invention reduces conducting losses and is operable with a fixed frequency switching signal.

Furthermore, the lossless operation of the improved power converters of the present invention is achieved with a snubber circuit employing only passive circuit elements. That is, the snubber circuit in the improved power converter of the present invention includes only capacitors, inductors, and diodes. Since the improved power converters of the present invention does not require any additional active elements, such as a transistor switch for example, the number of relatively expensive components is reduced.

Lastly, the improved converters using the snubber network of the present invention eliminate reverse recovery spikes because the decaying current through the inductor $L_4$ eliminates the diode reverse recovery of the diode $D_1$.

What is claimed is:

1. A snubber network for use with a device for converting power from an input voltage source to be supplied to an output load via a first inductor and a first diode, based on a duty cycle of a switching signal supplied to a controllable switch, the snubber network comprising:

a) a first series connection of an inductor, a diode, and a capacitor;

b) a second series connection of a capacitor and a diode; and c) a third series connection of a diode and an inductor, the third series connection arranged between the first and second series connection such that the inductor of the third series connection is coupled at a node between the diode and the capacitor of the first series connection and the diode of the third series connection is coupled at a node between the capacitor and the diode of the second series connection.

2. The snubber network of claim 1 wherein the inductor of the third series connection is coupled with the cathode of the diode of the first series connection and wherein the cathode of the diode of the third series connection is coupled with the anode of the diode of the second series connection.

3. In a power conversion circuit which converts an input voltage to an output voltage supplied across a load based on a duty cycle of a switching signal supplied to a controllable switch, and which includes an inductor and a diode arranged in a main current path and a capacitor arranged across the load, a snubber network comprising:

a) a first series connection of an inductor, a diode, and a capacitor, the first series connection being coupled across the controllable switch of the power conversion circuit;

b) a second series connection of a capacitor and a diode, the second series connection being arranged such that the cathode of the diode of the second series connection is coupled with the output voltage; and c) a third series connection of a diode and an inductor, the third series connection arranged between the first and second series connection such that the inductor of the third series connection is coupled at a node between the diode and the capacitor of the first series connection and the diode of the third series connection is coupled at a node between the capacitor and the diode of the second series connection.

4. The snubber network of claim 3 further comprising a further inductor coupled with the cathode of the diode of the power conversion circuit.

5. The snubber network of claim 3 wherein when the controllable switch is closed, voltage stored in the capacitor of the second series connection increases to the output voltage and when the controllable switch is opened, the voltage stored in the capacitor of the second series connection decreases to zero.

6. The snubber network of claim 5 wherein when the controllable switch is closed, voltage stored in the capacitor of the first series connection decreases from the output voltage to zero and when the controllable switch is opened, the voltage stored in the capacitor of the first series connection quickly increases to the output voltage.

7. The snubber network of claim 6 wherein the voltage of the first series connection overshoots the output voltage.

8. The snubber network of claim 3 wherein, at the instant when the controllable switch is opened, current through the controllable switch is relatively low such that switching losses are minimized.

9. The snubber network of claim 3 wherein, at the instant when the controllable switch is closed, voltage across the controllable switch is relatively low such that switching losses are minimized.

10. The snubber network of claim 3 further comprising a clamping diode coupled across the capacitor of the first series connection.

11. The snubber network of claim 2 wherein the device for converting is a boost power converter.

12. The snubber network of claim 2 wherein the device for converting is a buck power converter.

13. The snubber network of claim 2 wherein the device for converting is a forward power converter.

14. The snubber network of claim 2 wherein the device for converting is a flyback power converter.

15. In a power conversion circuit which converts an input voltage to an output voltage supplied across a load based on a duty cycle of a switching signal supplied to a controllable switch, and which includes an inductor and a diode arranged in a main current path and a capacitor arranged across the load, a snubber network comprising:

a) a first series connection of an inductor, a diode, and a capacitor, the first series connection being coupled across the controllable switch of the power conversion circuit;

b) a second series connection of a capacitor and a diode, the second series connection being arranged such that the cathode of the diode of the second series connection is coupled with the input voltage; and c) a third series connection of a diode and an inductor, the third series connection arranged between the first and second series connection such that the inductor of the third series connection is coupled at a node between the diode and the capacitor of the first series connection and the diode of the third series connection is coupled at a node between the capacitor and the diode of the second series connection.

16. The snubber network of claim 15 further comprising a further inductor coupled with the cathode of the diode of the power conversion circuit.

17. The snubber network of claim 15 wherein when the controllable switch is closed, voltage stored in the capacitor of the second series connection increases to the output voltage and when the controllable switch is opened, the voltage stored in the capacitor of the second series connection decreases to zero.

18. The snubber network of claim 13 wherein when the controllable switch is closed, voltage stored in the capacitor of the first series connection decreases from the output voltage to zero and when the controllable switch is opened, the voltage stored in the capacitor of the first series connection quickly increases to the output voltage.

19. The snubber network of claim 18 wherein the voltage of the first series connection overshoots the output voltage.

20. The snubber network of claim 15 wherein, at the instant when the controllable switch is opened, current through the controllable switch is relatively low such that switching losses are minimized.

21. The snubber network of claim 15 wherein, at the instant when the controllable switch is closed, voltage across the controllable switch is relatively low such that switching losses are minimized.

22. The snubber network of claim 15 further comprising a clamping diode coupled across the capacitor of the first series connection.

* * * * *